United States Patent [19]

Ninomiya et al.

[11] Patent Number: 5,422,857
[45] Date of Patent: Jun. 6, 1995

[54] SEMICONDUCTOR MEMORY UNIT HAVING OVERLAPPING ADDRESSES

[75] Inventors: Kazuki Ninomiya; Tomoharu Kawada, both of Osaka, Japan

[73] Assignee: Matsushita Electric Industrial Co., Ltd., Osaka, Japan

[21] Appl. No.: 235,263

[22] Filed: Apr. 29, 1994

Related U.S. Application Data

[63] Continuation of Ser. No. 612,730, Nov. 14, 1990, abandoned.

[30] Foreign Application Priority Data

Nov. 21, 1989 [JP] Japan .................................. 1-302828

[51] Int. Cl.⁶ .......................................... G11C 7/00
[52] U.S. Cl. ................................ 365/230.05; 365/63; 365/189.02
[58] Field of Search ................... 395/400; 365/51, 63, 365/230.01, 230.05, 190, 189.02

[56] References Cited

U.S. PATENT DOCUMENTS

| | | | |
|---|---|---|---|
| 4,667,310 | 5/1987 | Takada | 365/190 |
| 4,768,172 | 8/1988 | Sasaki | 365/230.05 |
| 4,775,942 | 10/1988 | Ferreri et al. | 365/51 |
| 4,791,607 | 12/1988 | Igarashi et al. | 365/230.05 |
| 4,833,648 | 5/1989 | Seharrer et al. | 365/230.05 |
| 5,023,844 | 6/1991 | Arnold et al. | 365/230.05 |

FOREIGN PATENT DOCUMENTS

| | | | |
|---|---|---|---|
| 0236188 | 11/1985 | Japan | 365/230.05 |
| 0076092 | 4/1987 | Japan | 365/230.05 |
| 92/8230 | 5/1982 | WIPO | 365/230.05 |

OTHER PUBLICATIONS

Sheldon S. L. Chang, "Multiple-Read Single Write Memory and Its Applications" IEEE Transactions on Computers vol. C.29 No. 8 Aug. 1980.

*Primary Examiner*—Jack B. Harvey
*Assistant Examiner*—Jack A. Lane
*Attorney, Agent, or Firm*—Lowe, Price, LeBlanc & Becker

[57] ABSTRACT

A memory unit includes a plurality of read bit lines, a plurality of read word lines, a plurality of write bit lines, and a plurality of write word lines. An array of memory cells are connected to the read bit lines, the read word lines, the write bit lines, and the write word lines. Each of the memory cells includes at least two input sections, at least two output sections, and a memory element. The output sections are connected to at least two of the read word lines, respectively, and output data from the memory element to one of the read bit lines in response to signals on the read word lines. The input sections are connected to at least two of the write word lines, respectively, and output data from one of the write bit lines into the memory element in response to signals on the write word lines. A plurality of decoders connected to the read word lines decode a read address signal into output signals, respectively, which are fed to the read word lines. A plurality of decoders connected to the write word lines decode a write address signal into output signals, respectively, which are fed to the write word lines.

5 Claims, 11 Drawing Sheets

SEMICONDUCTOR MEMORY UNIT HAVING OVERLAPPING ADDRESSES

This application is a continuation of application Ser. No. 07/612,730, filed Nov. 14, 1990, now abandoned.

BACKGROUND OF THE INVENTION

This invention relates to a memory unit such as a semiconductor-type memory unit usable in a microprocessor and other devices.

Generally, microprocessors include register files having a given number of registers. In cases where a microprocessor control program branches from a main routine to a subroutine, if the data values used in the main routine are left in the register file, a smaller number of the registers can be used in the subroutine since the total number of the registers is fixed. A conventional way of preventing such a drawback is to save the data values into another memory to increase the number of the registers usable in the subroutine.

Advanced register files having a register window structure have been proposed to increase the speed of operation of a microprocessor. Such a register file is divided into a plurality of windows corresponding to a main routine and subroutines of a microprocessor control program. Each time the microprocessor control program branches from the main routine to a subroutine or each time the program returns from a subroutine to the main routine, a change between the windows is executed. This window change removes the need of saving register data into a memory, so that a speed of operation of the microprocessor can be increased.

In an advanced register file having a register window structure, some registers are used in common by different windows, and data can be transferred between subroutines via the common registers. Each of memory cells in a common register have two different addresses. As will be explained later, the prior art register file of such a type has a problem in operation speed.

SUMMARY OF THE INVENTION

It is an object of this invention to provide an improved memory unit.

A first aspect of this invention provides a memory unit comprising a plurality of read bit lines; a plurality of read word lines; a plurality of write bit lines; a plurality of write word lines; an array of memory cells connected to the read bit lines, the read word lines, the write bit lines, and the write word lines, wherein each of the memory cells includes at least two input sections, at least two output sections, and a memory element, wherein the output sections are connected to at least two of the read word lines respectively and output data from the memory element to one of the read bit lines in response to signals on the read word lines, wherein the input sections are connected to at least two of the write word lines respectively and output data from one of the write bit lines into the memory element in response to signals on the write word lines; a plurality of decoders connected to the read word lines and decoding a read address signal into output signals respectively which are fed to the read word lines; and a plurality of decoders connected to the write word lines and decoding a write address signal into output signals respectively which are fed to the write word lines.

A second aspect of this invention provides a memory unit comprising a plurality of bit lines; a plurality of word lines; an array of memory cells connected to the bit lines and the word lines, wherein each of the memory cells includes at least two input/output sections and a memory element connected to the input/output sections, wherein the input/output sections are connected to at least two of the word lines respectively and are connected to at east two of the bit lines respectively, and wherein the input/output sections transmit data between the memory element and the bit lines in response to signals on the word lines; and a plurality of decoders connected to the word lines and decoding an address signal into output signals respectively which are fed to the word lines.

A third aspect of this invention provides a memory unit comprising a plurality of bit lines; a plurality of word lines; an array of memory cells connected to the bit lines and the word lines; and a decoding unit including a decoding section, a gate circuit, and a word line driver, wherein the decoding section decodes an address signal into output signals, wherein the gate circuit executes predetermined logical operation between the output signals of the decoding section and a control signal, and wherein the word line driver drives the word lines in response to an output signal from the gate circuit.

A fourth aspect of this invention provides a memory unit comprising a plurality of bit lines; a plurality of word lines; an array of memory cells connected to the bit lines and the word lines; and a decoding unit including a decoding section and a word line driver, wherein the decoding section decodes an address signal into output signals, wherein the word line driver drives the word lines in response to the output signals of the decoding section; wherein the decoding section includes a plurality of logic operation circuits executing predetermined logic operations on the address signal, and wherein each of the logic operation circuits includes a transistor set and a transistor of a first conduction type connected to the transistor set, the transistor set including transistors of a second conduction type which are connected in series.

A fifth aspect of this invention provides a memory unit comprising a memory cell array divided into words including overlap words, wherein each of the overlap words has a pair of a first address and a first window number and also a pair of a second address and a second window number; first decoding means for decoding an address signal and a window signal into a first word selection signal; second decoding means for decoding the address signal and the window signal into a second word selection signal; and means for selecting one of the words of the memory cell array in response to the first word selection signal and the second word selection signal, and executing an access to the selected word; wherein the first decoding means operates for the address signal and the window signal which designate the pair of the first address and the first window number of one of the overlap words, and the second decoding means operates for the address signal and the window signal which designate the pair of the second address and the second window number of one of the overlap words.

DESCRIPTION OF THE PRIOR ART

Figure 1:
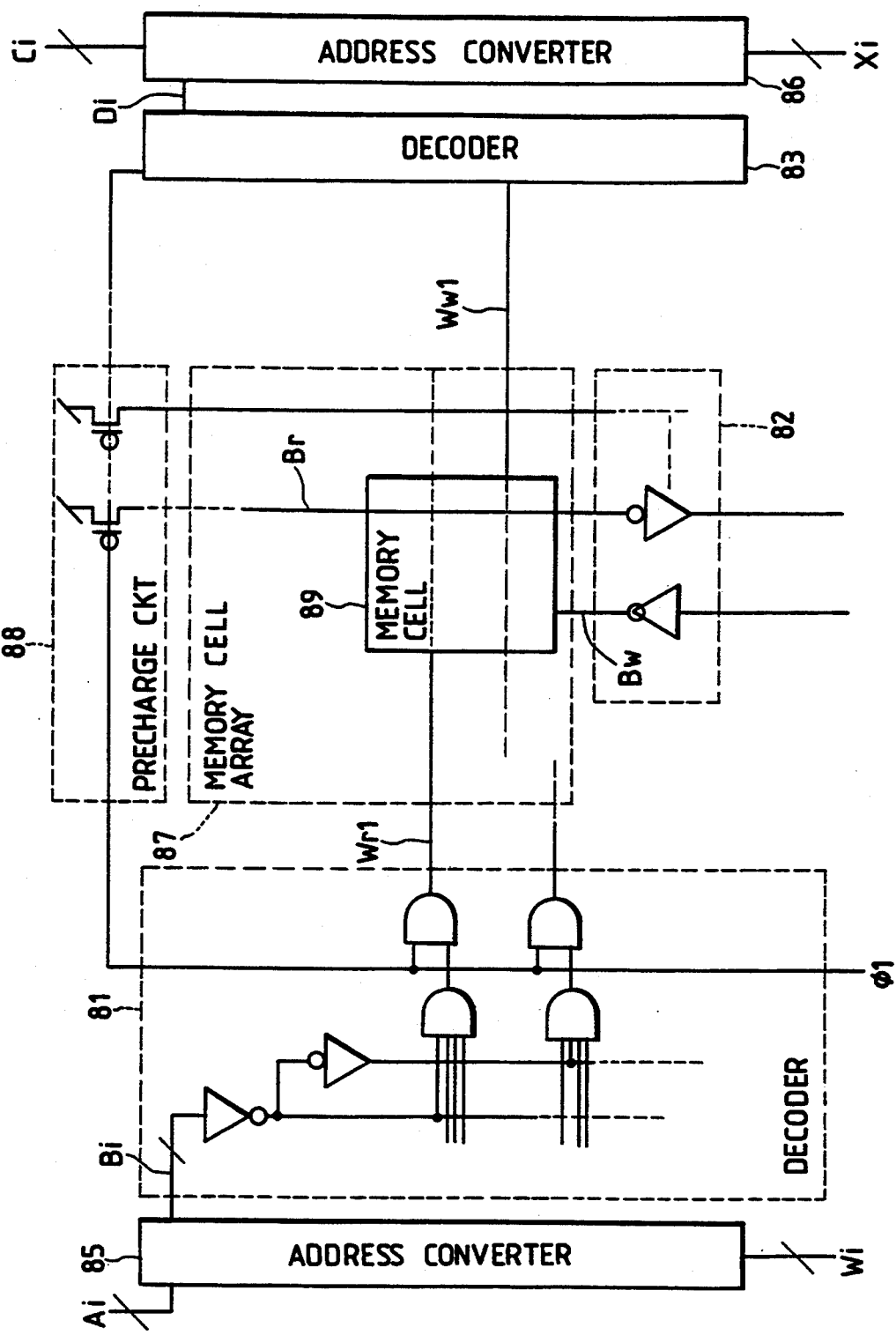
FIG. 1 is a block diagram of a prior art memory unit.
Figure 2:
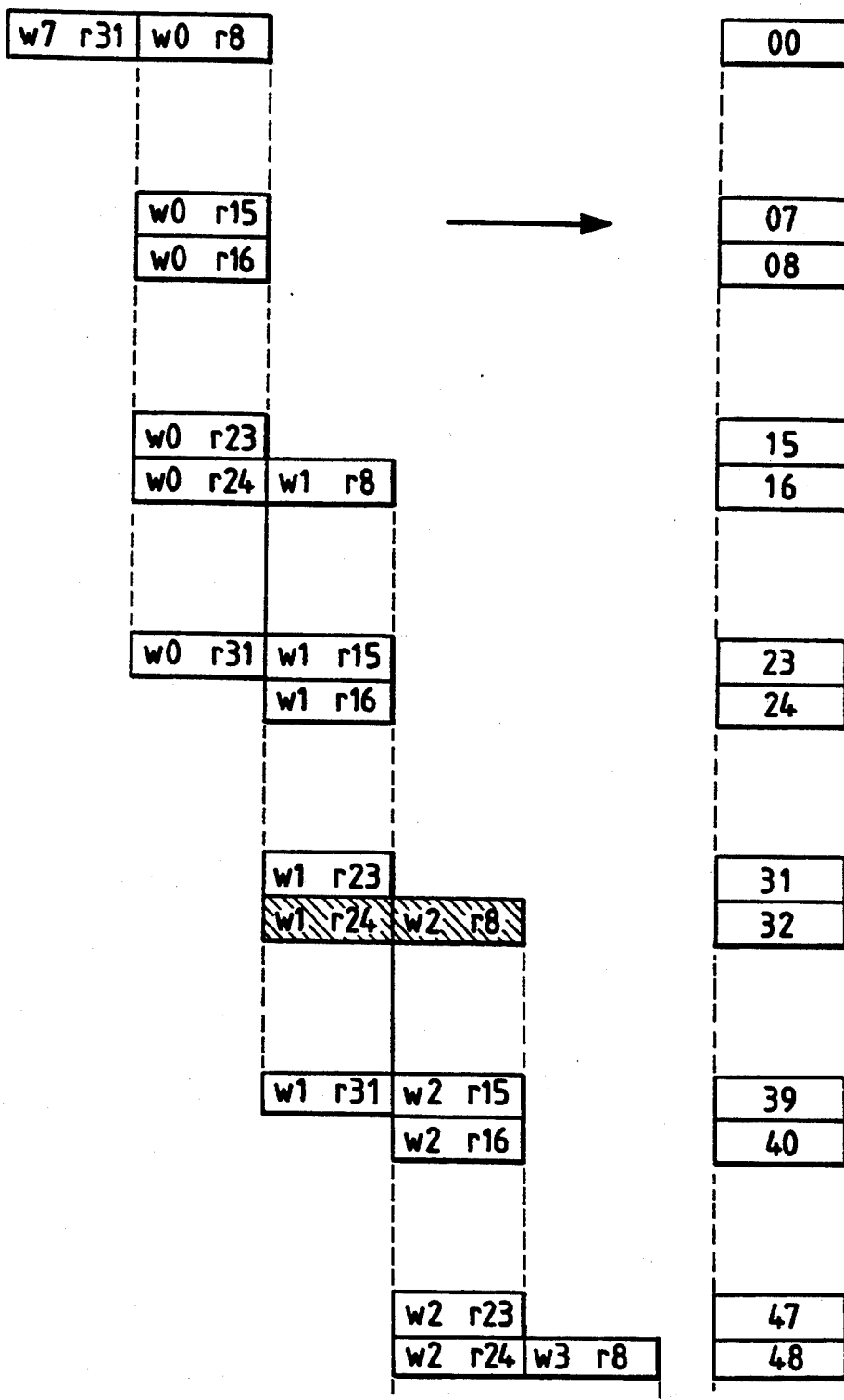
FIG. 2 is a diagram showing the relation among original address signals, window signals, and final address signals in the prior art memory unit of FIG. 1.

As suggested previously, there is a prior art memory unit in which one memory cell has plurality of addresses. FIG. 1 shows an example of the prior art memory unit. To obtain a one-to-one correspondence between memory cells and addresses, the prior art memory unit performs address conversion such as shown in FIG. 2. The prior art memory unit has a precharge circuit which operates in synchronism with a clock signal $\Phi 1$. The prior art memory unit is designed as a register file having 8 windows each having 32 registers.

The prior art memory unit will be further explained. In FIG. 1, an address converter 85 generates a final address signal Bi in response to an original address signal Ai and a window signal Wi. The final address signal Bi is fed to a decoder 81. The decoder 81 is connected to read word lines Wr1 leading to an array 87 of memory cells 89. The memory cell array 87 has a capacity of, for example, 136 words by 32 bits.

Figure 3:
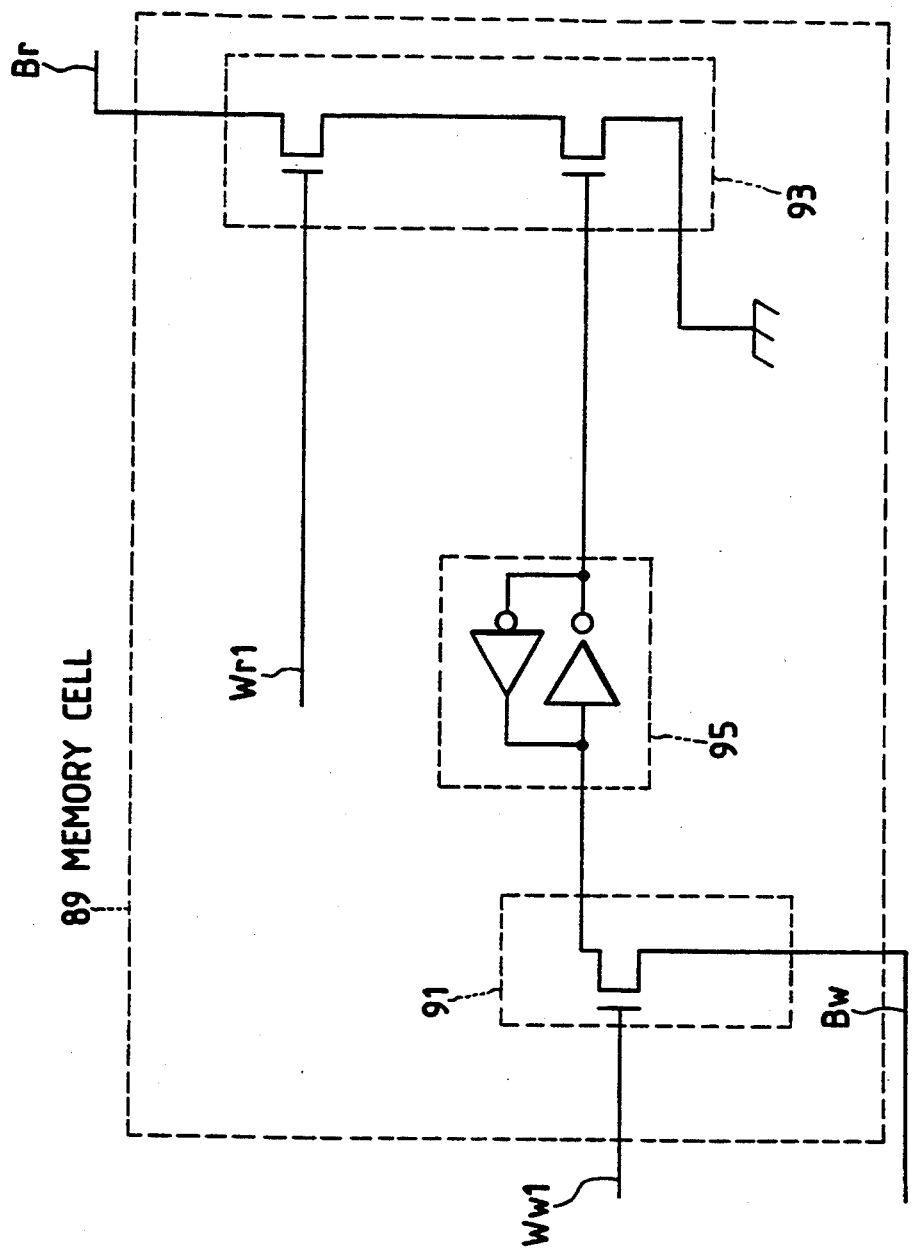
FIG. 3 is a diagram of a memory cell in the prior art memory unit of FIG. 1.

As shown in FIG. 3, each memory cell 89 includes an input section 91, an output section 93, and a memory element 95 connected between the input section 91 and the output section 93. A read word line Wr1 extending from the decoder 81 is connected to the output section 93 of the memory cell 89. In addition, the output section 93 is connected to a read bit line Br. The read bit line Br leads to a precharge circuit 88 and an input/output device 82.

An address converter 86 generates a final address signal Di in response to an original address signal Ci and a window signal Xi. The final address signal Di is fed to a decoder 83. The decoder 83 is connected to write word lines Ww1 leading to the memory cell array 87. As shown in FIG. 3, a write word line Ww1 extending from the decoder 83 is connected to the input section 91 of a memory cell 89. In addition, the input section 91 is connected to a write bit line Bw. The write bit line Bw leads to the input/output device 82.

During a data reading mode of operation of the memory unit, the original address signal Ai and the window signal Wi are inputted into the address converter 85. The window signal Wi designates a used window. The address converter 85 executes the address conversion of FIG. 2, generating the final address signal Bi in response to the original address signal Ai and the window signal Wi. In FIG. 2, w0–w7 denote the window signal and r0–r31 denote the original address signal. The final address signal Bi is decoded by the decoder 81, and a read word line Wr1 corresponding to the final address signal Bi is activated by the decoder 81. The output sections 93 of the memory cells 89 which are connected to the activated word line Wr1 are controlled in response to the word line activation, and the output sections 93 discharge and charge the read bit lines Br connected thereto in accordance with data in the memory elements 95 and thereby output the data from the memory elements 95 to the read bit lines Br. It should be noted that the read bit lines Br are precharged by the precharge circuit 88 before being discharged. The data on the read bit lines Br are transmitted to an external circuit (not shown) via the input/output device 82.

During a data writing mode of operation of the memory unit, the original address signal Ci and the window signal Xi are inputted into the address converter 86. The window signal Xi designates a used window. The address converter 86 executes the address conversion of FIG. 2, generating the final address signal Di in response to the original address signal Ci and the window signal Xi. In FIG. 2, w0–w7 denote the window signal and r0–r31 denote the original address signal. The final address signal Di is decoded by the decoder 83, and a write word line Ww1 corresponding to the final address signal Di is activated by the decoder 83. Data to be written into the memory cell array 87 are inputted into the input/output device 82, and are then transmitted to the write bit lines Bw. The input sections 91 of the memory cells 89 which are connected to the activated word line Ww1 are controlled in response to the word line activation, and the input sections 91 transmit the data from the write bit lines Bw to the memory cells 89 so that the data are written into the memory cells 89.

In the prior art memory unit of FIGS. 1–3, the address conversion spends an additional processing time, and the data reading and writing operations are delayed by times corresponding to the processing time spent in the address conversion. Thus, the address conversion causes a serious limit to the speed of operation of the memory unit.

For example, in the case where the original address signal Ai has a state "Ai=8" and the window signal Wi has a state "Wi=2" or in the case where the original address signal Ai has a state "Ai=24" and the window signal Wi has a state "Wi=1" as illustrated in the hatched segments of FIG. 2, the address conversion requires the following calculation to derive the final address signal Bi having a state "Bi=32".

$$Bi = MOD((Ai-8) + Wi \times 16)$$

where MOD denotes the remainder. Since the access to the target register is started after the above-mentioned calculation is completed, the access to the target register is delayed.

DESCRIPTION OF THE FIRST PREFERRED EMBODIMENT

Figure 4:
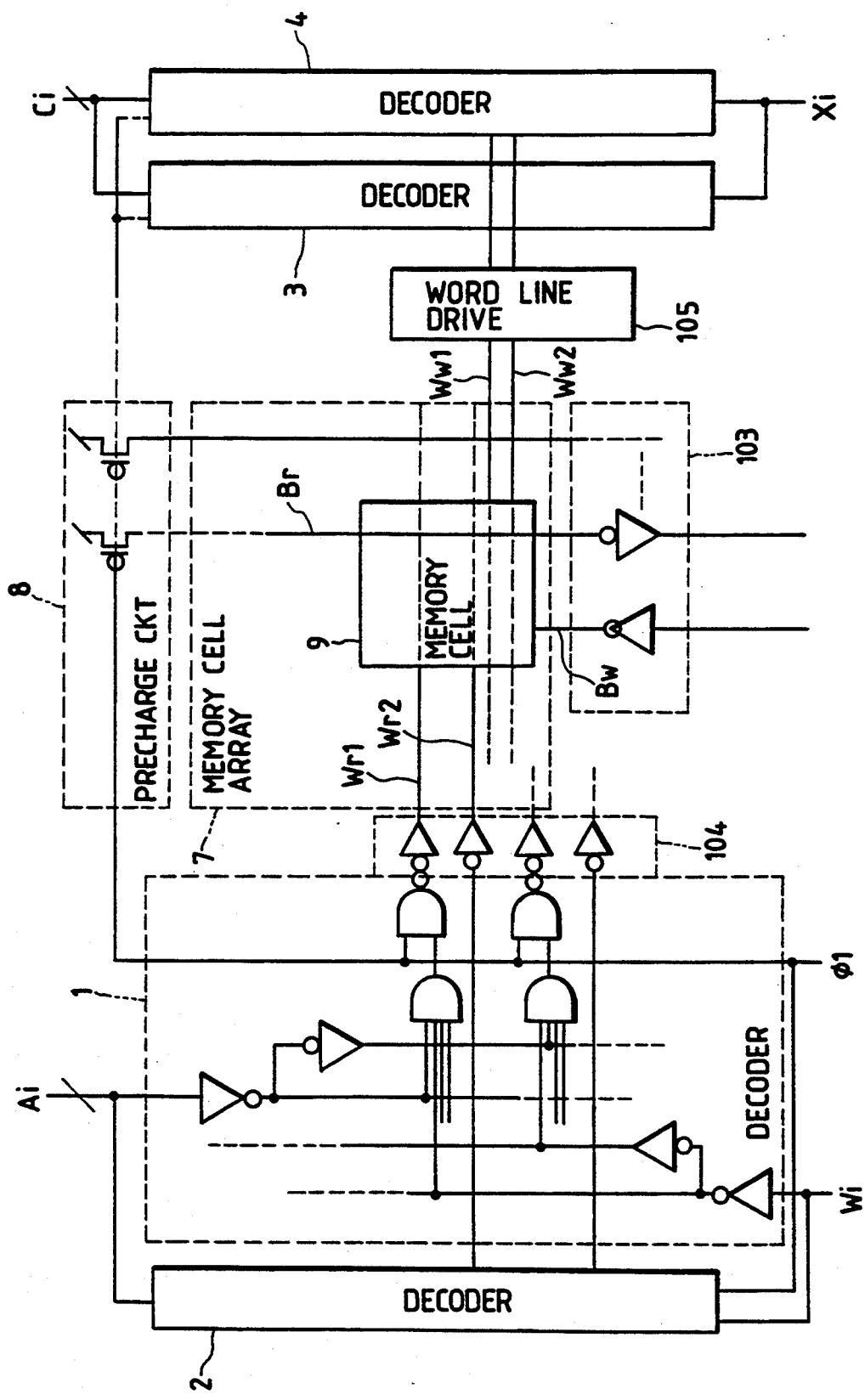
FIG. 4 is a block diagram of a memory unit according to a first embodiment of this invention.

With reference to FIG. 4, a memory unit has 8 windows each having 32 registers. The memory unit includes an array 7 of memory cells 9. The memory cell array 7 has a capacity of, for example, 136 words by 32 bits.

Figure 5:
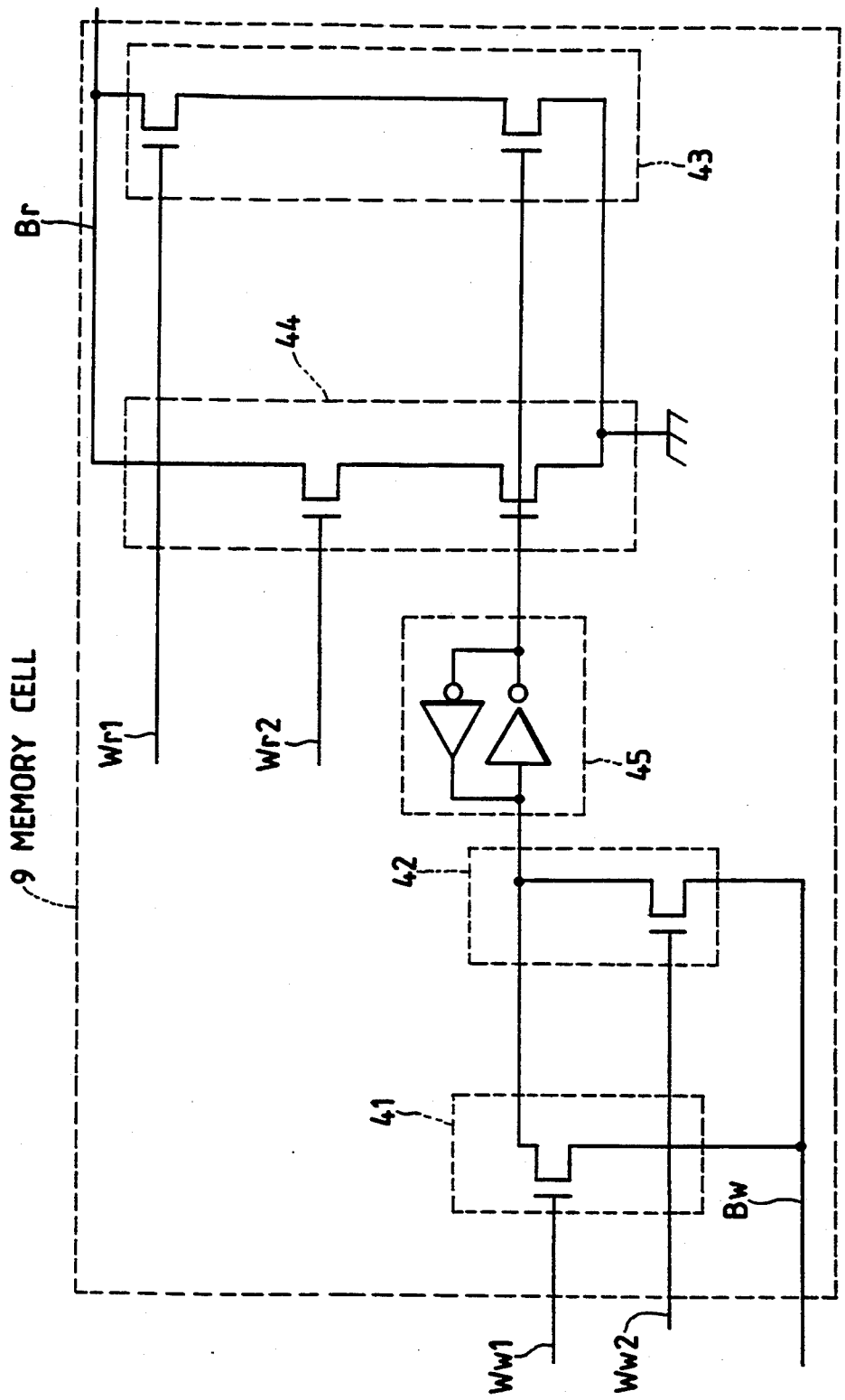
FIG. 5 is a diagram of a memory cell in the memory unit of FIG. 4.

As shown in FIG. 5, each memory cell 9 includes input sections 41 and 42, output sections 43 and 44, and a memory element 45 connected between the input sections 41 and 42 and the output sections 43 and 44. The output sections 43 and 44 are connected to a read bit line Br. The output sections 43 and 44 serve to output data from the memory element 45 to the read bit line Br. Read word lines Wr1 and Wr2 are connected to the output sections 43 and 44 respectively. The input sections 41 and 42 are connected to a write bit line Bw. The input sections 41 and 42 serve to input data from the write bit line Bw into the memory element 45. Write word lines Ww1 and Ww2 are connected to the input sections 41 and 42 respectively.

The output terminals of decoders 1 and 2 are connected to the input terminals of a word line driver 104. The decoders 1 and 2 receive an address signal Ai and a window signal Wi. In addition, the decoders 1 and 2 receive a clock signal $\Phi 1$. The decoders 1 and 2 operate in synchronism with the clock signal $\Phi 1$. The read word lines Wr1 and Wr2 extend from the output terminals of the word line driver 104 to the output sections 43 and 44 of the memory cells 9. The word line driver 104 has separate sections in two groups. The read word lines Wr1 are connected to the decoder 1 via the first-group sections of the word line driver 104. The read word lines Wr2 are connected to the decoder 2 via the second-group sections of the word line driver 104.

A precharge circuit 8 receiving a clock signal $\Phi 1$ is connected to the read bit lines Br extending from the output sections 43 and 44 of the memory cells 9. The precharge circuit 8 serves to precharge the read bit lines Br in response to the clock signal $\Phi 1$. Thus, the precharge circuit 8 operates in synchronism with the clock signal $\Phi 1$.

An input/output device 103 is connected to the write bit lines Bw and the read bit lines Br leading to the input sections 41 and 42 and the output sections 43 and 44 of the memory cells 9. The input/output device 103 serves to transmit data from the read bit lines Bw to an external circuit (not shown). In addition, the input/output device 103 serves to transmit data from an external circuit (not shown) to the write bit lines Bw.

The output terminals of decoders 3 and 4 are connected to the input terminals of a word line driver 105. The decoders 3 and 4 receive an address signal Ci and a window signal Xi. The decoders 3 and 4 are similar in internal design to the decoders 1 and 2 respectively. The write word lines Ww1 and Ww2 extend from the output terminals of the word line driver 105 to the input sections 41 and 42 of the memory cells 9. The write word lines Ww1 are connected to the decoder 3 via the word line driver 105. The write word lines Ww2 are connected to the decoder 4 via the word line driver 105.

Figure 6:
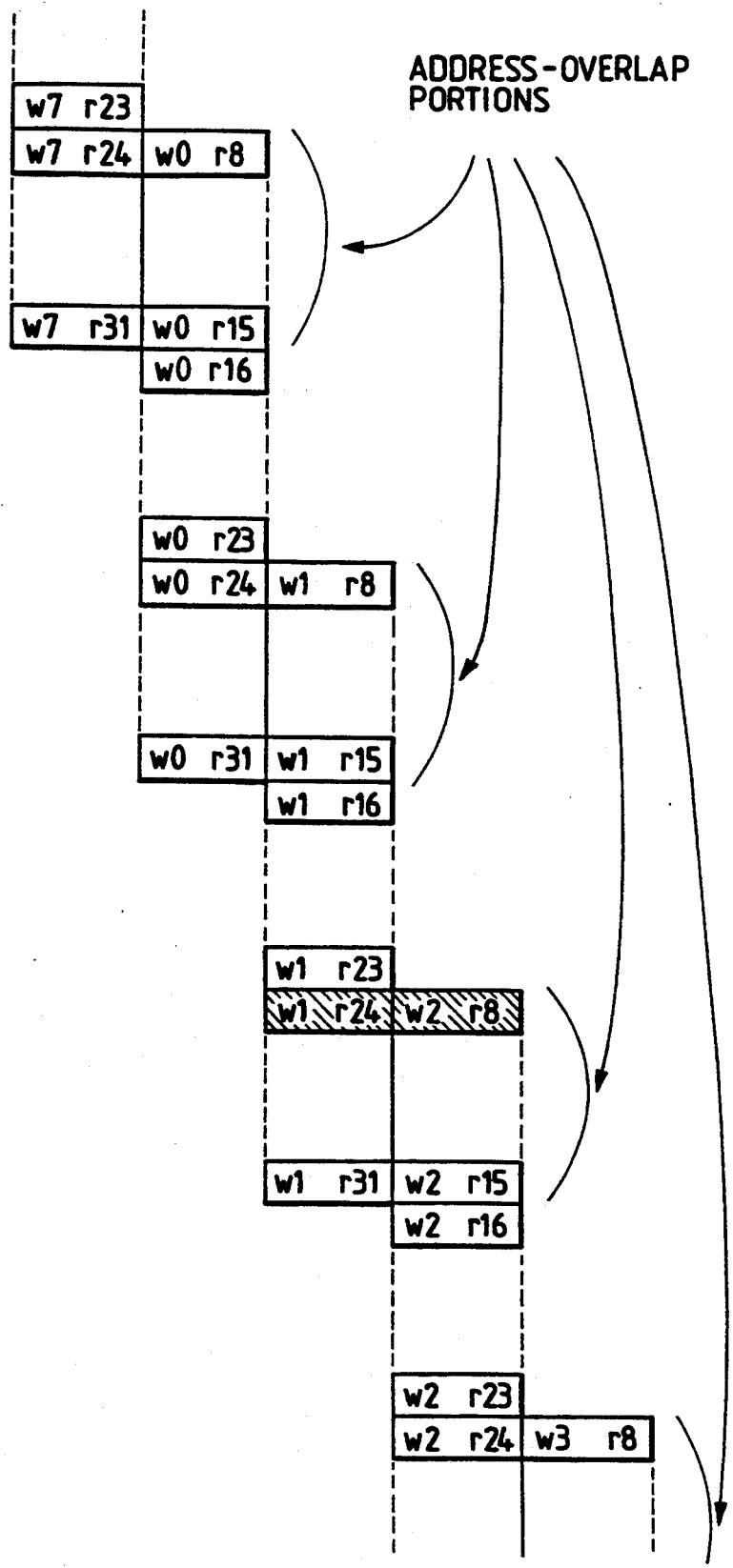
FIG. 6 is a diagram showing sets of addresses and window numbers in the memory unit of FIG. 4.

In FIG. 6, each segment represents a combination of an address signal (Ai, Ci) and a window signal (Wi, Xi), and w0–w7 denote the window signal and r0–r31 denote the address signal. As understood from FIG. 6, the memory cell array 7 is divided into sections each having 8 words and being sequentially arranged, and each of the words in alternate 8-word sections has two different addresses and two different window numbers while each of the words in the other alternate 8-word sections has a single address and a single window number.

During a data reading mode of operation of the memory unit, the address signal Ai and the window signal Wi are inputted into the decoders 1 and 2. The window signal Wi designates a window used. The address signal Ai and the window signal Wi are decoded by the decoders 1 and 2. One of the read word lines Wr1 and Wr2 is selected and is activated by the word line driver 104 in response to the output signals from the decoders 1 and 2 which depend on the address signal Ai and the window signal Wi. One of the decoders 1 and 2 is designed so that it will output an inactive signal for the address signal Ai and the window signal Wi designating a word having a single address, and that it will output an active signal for the address signal Ai and the window signal Wi designating a word having two addresses. The other of the decoders 1 and 2 is designed so that it will output an active signal for the address signal Ai and the window signal Wi designating a word having either a single address or two addresses. One of the decoders 1 and 2 executes the decoding of the left-hand members while the other executes the decoding of the right-hand members of the overlap segments of FIG. 6. The output sections 43 or 44 of the memory cells 9 which are connected to the activated word line Wr1 or Wr2 are controlled in response to the word line activation, and the output sections 43 or 44 discharge and charge the read bit lines Br connected thereto in accordance with data in the memory elements 45 and thereby output the data from the memory elements 45 to the read bit lines Br. It should be noted that the read bit lines Br are precharged by the precharge circuit 8 before being discharged. The data on the read bit lines Br are transmitted to an external circuit (not shown) via the input/output device 103.

The data reading mode of operation of the memory unit will be further explained with respect to the selection of a word having two addresses. For example, in the case where the address signal Ai has a state "Ai=8 (r8)" and the window signal Wi has a state "Wi=2 (w2)" as illustrated in the hatched segment of FIG. 6, one of the word lines Wr1 is activated by the cooperation between the decoder 1 and the word line driver 104. In the counterpart case where the address signal Ai has a state "Ai=24 (r24)" and the window signal Wi has a state "Wi=1 (w1)" as illustrated in the hatched segment of FIG. 6, one of the word lines Wr2 is activated by the cooperation between the decoder 2 and the word line driver 104.

During a data writing mode of operation of the memory unit, the address signal Ci and the window signal Xi are inputted into the decoders 3 and 4. The window signal Xi designates a window used. The address signal Ci and the window signal Xi are decoded by the decoders 3 and 4. One of the write word lines Ww1 and Ww2 is selected and is activated by the word line driver 105 in response to the output signals from the decoders 3 and 4 which depend on the address signal Ci and the window signal Xi. One of the decoders 3 and 4 is designed so that it will output an inactive signal for the address signal Ci and the window signal Xi designating a word having a single address, and that it will output an active signal for the address signal Ci and the window signal Xi designating a word having two addresses. The other of the decoders 3 and 4 is designed so that it will output an active signal for the address signal Ci and the window signal Xi designating a word having either a single address or two addresses. One of the decoders 3 and 4 executes the decoding of the left-hand members while the other executes the decoding of the right-hand members of the overlap segments of FIG. 6. The input sections 41 or 42 of the memory cells 9 which are connected to the activated word line Ww1 or Ww2 are controlled in response to the word line activation, and the input sections 41 or 42 transmit the data from the write bit lines Bw to the memory cells 45 so that the data are written into the memory cells 45.

The data writing mode of operation of the memory unit will be further explained with respect to the selection of a word having two addresses. For example, in the case where the address signal Ci has a state "Ci=8 (r8)" and the window signal Xi has a state "Xi=2 (w2)" as illustrated in the hatched segment of FIG. 6, one of the word lines Ww1 is activated by the cooperation between the decoder 3 and the word line driver 105. In the counterpart case where the address signal Ci has a state "Ci=24 (r24)" and the window signal Xi has a state "Xi=1 (w1)" as illustrated in the hatched segment of FIG. 6, one of the word lines Ww2 is activated by the cooperation between the decoder 4 and the word line driver 105.

As understood from the previous description, the memory unit dispenses with address conversion. Therefore, the memory unit is advantageous over the prior art of FIGS. 1–3 in the speed of data-reading and data-writing operation.

Various modifications may be made in this embodiment. For example, words each having a single address are divided into two groups which are equal in the number of members, and the words in the first group are allotted to the decoder 1 (or the decoder 3) while the words in the second group are allotted to the decoder 2 (or the decoder 4). In this case, the load capacities of the decoders 1 and 2 (or the decoders 3 and 4) are equalized so that a higher speed of operation of the memory unit is attained.

DESCRIPTION OF THE SECOND PREFERRED EMBODIMENT

Figure 7:
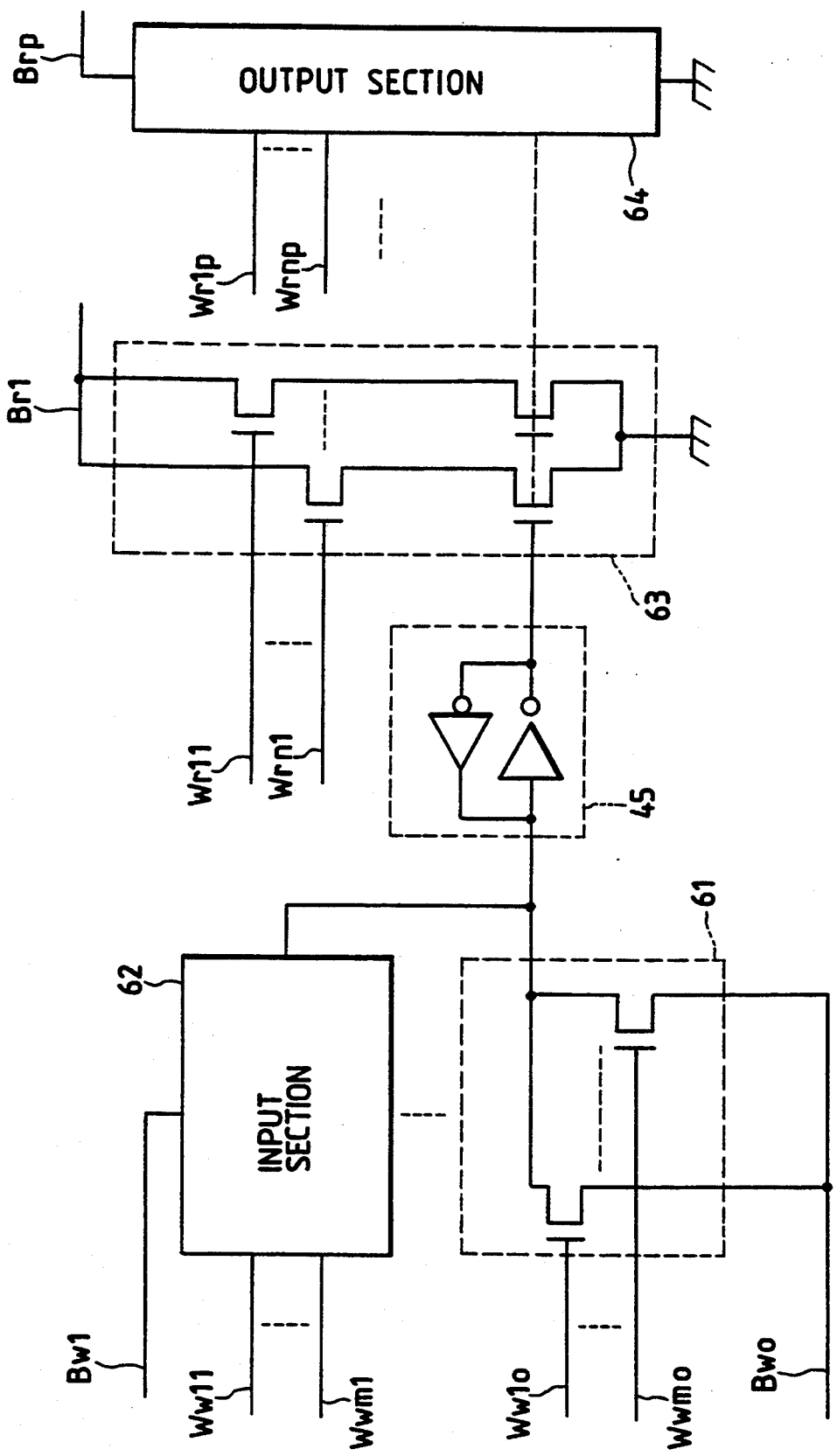
FIG. 7 is a diagram showing a memory cell in a memory unit according to a second embodiment of this invention.

FIG. 7 shows a part of a second embodiment of this invention which is similar to the embodiment of FIGS. 4–6 except for design changes indicated hereinafter. In the second embodiment: the number of write ports is equal to a predetermined number "o"; the number of read ports is equal to a predetermined number "p"; the number of overlapped write addresses is equal to a predetermined number "m"; and the number of overlapped read addresses is equal to a predetermined number "n".

With reference to FIG. 7, each memory cell includes input sections 61 and 62, output sections 63 and 64, and a memory element 45 connected between the input sections 61 and 62 and the output sections 63 and 64. The number of the input sections 61, and the number of the input sections 62 are equal to the number "o". Write bit lines Bw0 whose number equals the number "o" are connected to the input sections 61 respectively. Write bit lines Bw1 whose number equals the number "o" are connected to the input sections 62 respectively. Write word lines Ww10–Wwm0 whose number equals the number "m" are connected to the input sections 61. Write word lines Ww11–Wwm1 whose number equals the number "m" are connected to the input sections 62. The total number of such sets of write word lines is equal to the number "o".

The number of the output sections 63, and the number of the output sections 64 are equal to the number "p". Read bit lines Br0 whose number equals the number "p" are connected to the output sections 63 respectively. Read bit lines Brp whose number equals the number "p" are connected to the output sections 64 respectively. Read word lines Wr11–Wrn1 whose number equals the number "n" are connected to the output sections 63. Read word lines Wr1p–Wrnp whose number equals the number "n" are connected to the output sections 64 respectively. The total number of such sets of read word lines is equal to the number "p".

DESCRIPTION OF THE THIRD PREFERRED EMBODIMENT

Figure 8:
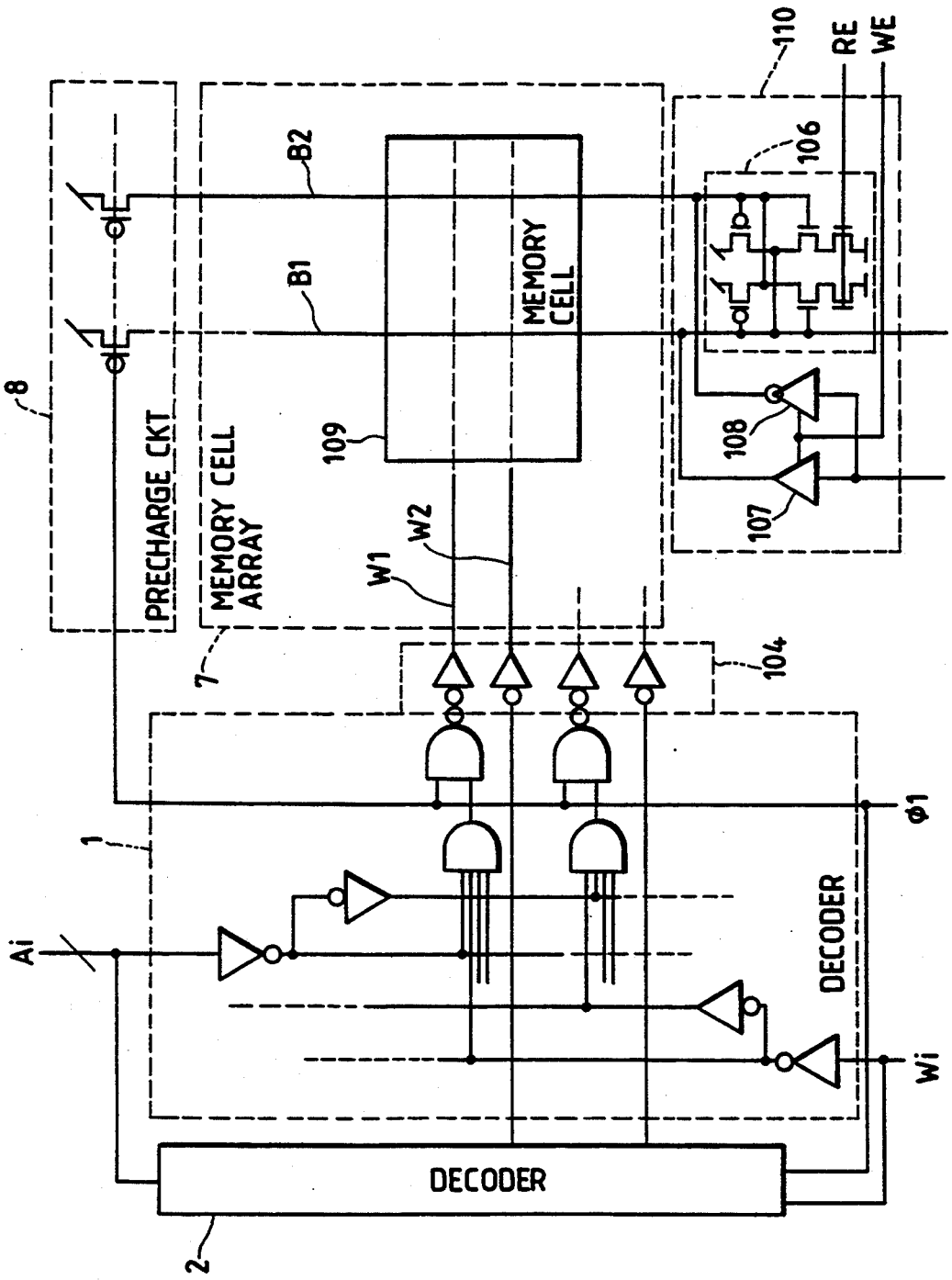
FIG. 8 is a block diagram of a memory unit according to a third embodiment of this invention.

With reference to FIG. 8, a memory unit has 8 windows each having 32 registers. The memory unit includes an array 7 of memory cells 109. The memory cell array 7 has a capacity of, for example, 136 words by 32 bits.

Figure 9:
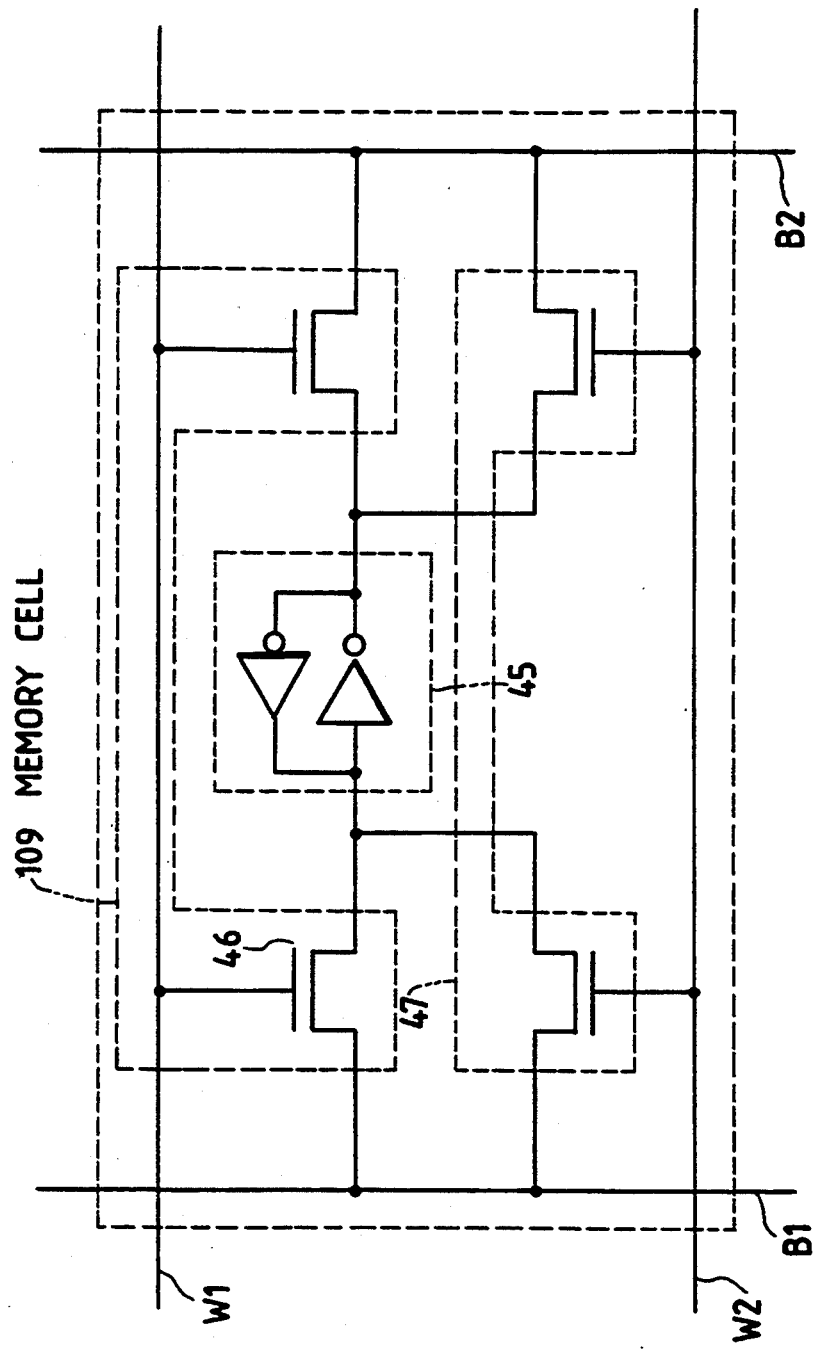
FIG. 9 is a diagram of a memory cell in the memory unit of FIG. 8.

As shown in FIG. 9, each memory cell 109 includes input/output sections 46 and 47, and a memory element 45 connected to the input/output sections 46 and 47. The input/output sections 46 and 47 are connected to bit lines B1 and B2. The input/output sections 46 and 47 serve to input data from the bit lines B1 and B2 into the memory element 45, and also serve to output data from the memory element 45 to the bit lines B1 and B2. A word line W1 is connected to the input/output section 46. A word line W2 is connected to the input/output section 47.

The output terminals of decoders 1 and 2 are connected to the input terminals of a word line driver 104. The decoders 1 and 2 receive an address signal Ai and a window signal Wi. In addition, the decoders 1 and 2 receive a clock signal $\Phi 1$. The decoders 1 and 2 operate in synchronism with the clock signal $\Phi 1$. The decoders 1 and 2 are similar to the corresponding decoders of the embodiment of FIGS. 4–6. The word lines W1 extend from first output terminals of the word line driver 104 to the input/output sections 46. The word lines W2 extend from second output terminals of the word line driver 104 to the input/output sections 47. The word line driver 104 has separate sections in two groups. The word lines W1 are connected to the decoder 1 via the first sections of the word line driver 104. The word lines W2 are connected to the decoder 2 via the second sections of the word line driver 104.

A precharge circuit 8 receiving a clock signal $\Phi 1$ is connected to the bit lines B1 and B2 extending from the input/output sections 46 and 47 of the memory cells 109. The precharge circuit 8 serves to precharge the bit lines B1 and B2 in response to the clock signal $\Phi 1$. Thus, the precharge circuit 8 operates in synchronism with the clock signal $\Phi 1$.

An input/output device 110 is connected to the bit lines B1 and B2 leading to the input/output sections 44 and 47 of the memory cells 109. The input/output device 110 serves to transmit data from the bit lines B1 and B2 to an external circuit (not shown). In addition, the input/output device 110 serves to transmit data from an external circuit (not shown) to the bit lines B1 and B2. The input/output device 110 is divided into segments corresponding to respective pairs of the bit lines B1 and B2, the segments each having a sense amplifier 106, a buffer 107, and an inverter 108. The input terminals of the buffer 107 and the inverter 108 are connected to a data input line (no reference character). The output terminal of the buffer 107 is connected to the bit line B1. The output terminal of the inverter 108 is connected to the bit line B2. The buffer 107 and the inverter 108 receive a write control signal WE. The sense amplifier 106 is connected to the bit lines B1 and B2. The sense amplifier 106 receives a read control signal RE.

As in the case of FIG. 6, the memory cell array 7 is divided into sections each having 8 words and being sequentially arranged, and each of the words in alternate 8-word sections has two different addresses and two different window numbers while each of the words in the other alternate 8-word sections has a single address and a single window number.

During a data reading mode of operation of the memory unit, the address signal Ai and the window signal Wi are inputted into the decoders 1 and 2. The window signal Wi designates a used window. The address signal Ai and the window signal Wi are decoded by the decoders 1 and 2. One of the word lines W1 and W2 is selected and is activated by the word line driver 104 in response to the output signals from the decoders 1 and 2 which depend on the address signal Ai and the window signal Wi. One of the decoders 1 and 2 is designed so that it will output an inactive signal for the address signal Ai and the window signal Wi designating a word having a single address, and that it will output an active signal for the address signal Ai and the window signal Wi designating a word having two addresses. The other of the decoders 1 and 2 is designed so that it will output an active signal for the address signal Ai and the window signal Wi designating a word having either a single address or two addresses. One of the decoders 1 and 2 executes the decoding of the left-hand members while the other executes the decoding of the right-hand members of the overlap segments of FIG. 6. The input/output sections 46 or 47 of the memory cells 109 which are connected to the activated word line W1 or W2 are controlled in response to the word line activation, and the input/output sections 46 or 47 discharge and non-discharge the bit lines B1 or B2 connected thereto in accordance with data in the memory elements 45 and thereby output the data from the memory elements 45 to the bit lines B1 or B2 as potential differences between the bit lines B1 and B2. It should be noted that the bit lines B1 and B2 are precharged by the precharge circuit 8 before being discharged. At a subsequent moment, the read control signals RE are fed to the sense amplifiers 106 in the input/output device 110, and the data-representing potential differences between the bit lines B1 and B2 are amplified by the sense amplifiers 106 and the amplified data-representing potential differences are transmitted from the sense amplifiers 106 to the external circuit (not shown).

The data reading mode of operation of the memory unit will be further explained with respect to the selection of a word having two addresses. For example, in the case where the address signal Ai has a state "Ai=8 (r8)" and the window signal Wi has a state "Wi=2 (w2)" as illustrated in the hatched segment of FIG. 6, one of the word lines W1 is activated by the cooperation between the decoder 1 and the word line driver 104. In the counterpart case where the address signal Ai has a state "Ai=24 (r24)" and the window signal Wi has a state "Wi=1 (w1)" as illustrated in the hatched segment of FIG. 6, one of the word lines W2 is activated by the cooperation between the decoder 2 and the word line driver 104.

During a data writing mode of operation of the memory unit, the address signal Ai and the window signal Wi are inputted into the decoders 1 and 2. The window signal Wi designates a used window. The address signal Ai and the window signal Wi are decoded by the decoders 1 and 2. One of the word lines W1 and W2 is selected and is activated by the word line driver 105 in response to the output signals from the decoders 1 and 2 which depend on the address signal Ai and the window signal Wi. One of the decoders 1 and 2 is designed so that it will output an inactive signal for the address signal Ai and the window signal Wi designating a word having a single address, and that it will output an active signal for the address signal Ai and the window signal Wi designating a word having two addresses. The other of the decoders 1 and 2 is designed so that it will output an active signal for the address signal Ai and the window signal Wi designating a word having either a single address or two addresses. One of the decoders 1 and 2 executes the decoding of the left-hand members while the other executes the decoding of the right-hand members of the overlap segments of FIG. 6. At the same time, data are fed to the input/output device 110 from the external circuit (not shown). When the write control signals WE are applied to the buffers 107 and the inverters 108 of the input/output device 110, the data are transmitted via the buffers 107 and the inverters 108 to the bit lines B1 and B2. The input/output sections 46 or 47 of the memory cells 109 which are connected to the activated word line W1 or W2 are controlled in response to the word line activation, and the input/output sections 46 or 47 transmit the data from the bit lines B1 and B2 to the memory cells 45 so that the data are written into the memory cells 45.

The data writing mode of operation of the memory unit will be further explained with respect to the selection of a word having two addresses. For example, in the case where the address signal Ai has a state "Ci=8 (r8)" and the window signal Wi has a state "Xi=2 (w2)" as illustrated in the hatched segment of FIG. 6, one of the word lines W1 is activated by the cooperation between the decoder 1 and the word line driver 104. In the counterpart case where the address signal Ai has a state "Ci=24 (r24)" and the window signal Wi has a state "Xi=1 (w1)" as illustrated in the hatched segment of FIG. 6, one of the word lines W2 is activated by the cooperation between the decoder 2 and the word line driver 104.

As understood from the previous description, the memory unit dispenses with address conversion. Therefore, the memory unit is advantageous over the prior art of FIGS. 1-3 in the speed of data-reading and data-writing operation.

Various modifications may be made in this embodiment. For example, words each having a single address are divided into two groups which are equal in the number of members, and the words in the first group are allotted to the decoder 1 while the words in the second group are allotted to the decoder 2. In this case, the load capacities of the decoders 1 and 2 are equalized so that a higher speed of operation of the memory unit is attained.

DESCRIPTION OF THE FOUR PREFERRED EMBODIMENT

Figure 10:
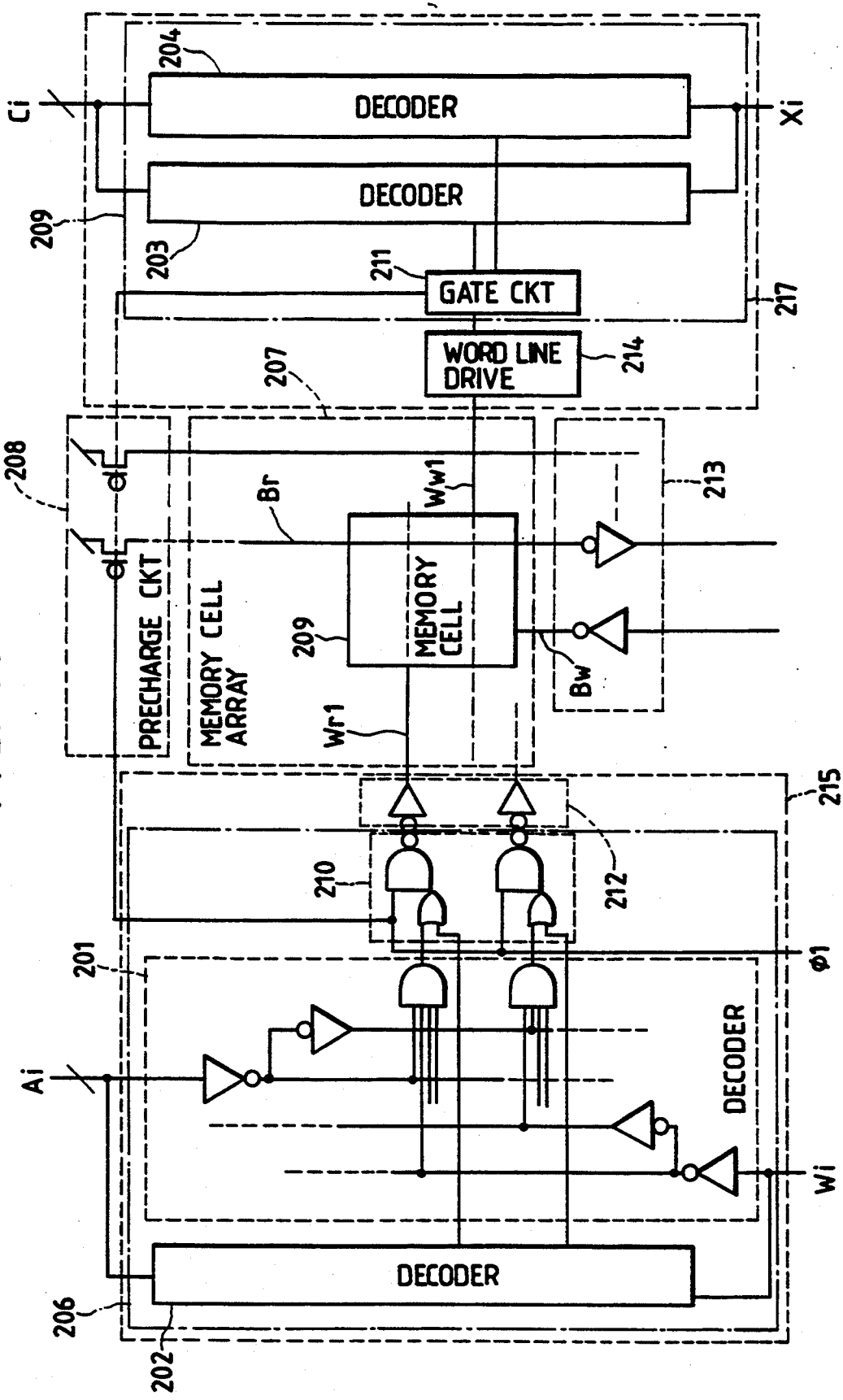
FIG. 10 is a block diagram of a memory unit according to a fourth embodiment of this invention.

With reference to FIG. 10, a memory unit has 8 windows each having 32 registers. The memory unit includes an array 207 of memory cells 209. The memory cell array 207 has a capacity of, for example, 136 words by 32 bits.

The memory cells 209 are similar to the memory cell of FIG. 8. Each memory cell 209 includes an input section 91, an output section 98, and a memory element 95 connected between the input section 91 and the output section 98. The output section 98 is connected to a read bit line Br. The output section 93 serves to output data from the memory element 45 to the read bit line Br. A read word line Wr1 is connected to the output section 93. The input section 91 is connected to a write bit line Bw. The input section 91 serves to input data from the write bit line Bw into the memory element 45. A write word line Ww1 is connected to the input section 91.

An address decoding unit 215 includes a decoder section 206 and a word line driver 212. The decoder section 206 includes decoders 201 and 202, and a gate circuit 210. The output terminals of decoders 1 and 2 are connected to the input terminals of the gate circuit 210. The output terminals of the gate circuit 210 are connected to the input terminals of the word line driver 212. The decoders 201 and 202 receive an address signal Ai and a window signal Wi. In addition, the decoders 201 and 202 receive a clock signal $\Phi 1$. The decoders 201 and 202 operate in synchronism with the clock signal $\Phi 1$. The read word lines Wr1 extend from the output terminals of the word line driver 212 to the output sections 93 of the memory cells 209.

A precharge circuit 208 receiving a clock signal $\Phi 1$ is connected to the read bit lines Br extending from the output sections 93 of the memory cells 209. The precharge circuit 208 serves to precharge the read bit lines Br in response to the clock signal $\Phi 1$. Thus, the precharge circuit 208 operates in synchronism with the clock signal $\Phi 1$.

An input/output device 213 is connected to the write bit lines Bw and the read bit lines Br leading to the input sections 91 and the output sections 93 of the memory cells 209. The input/output device 213 serves to transmit data from the read bit lines Bw to an external circuit (not shown). In addition, the input/output device 213 serves to transmit data from an external circuit (not shown) to the write bit lines Bw.

An address decoding unit 217 includes a decoder section 209 and a word line driver 214. The decoder section 209 includes decoders 203 and 204, and a gate circuit 211. The word line driver 214 and the gate circuit 211 are similar in internal design to the word line driver 212 and the gate circuit 210 respectively. The output terminals of decoders 203 and 204 are connected to the input terminals of the gate circuit 211. The output terminals of the gate circuit 211 are connected to the input terminals of the word line driver 211. The decoders 203 and 204 receive an address signal Ci and a window signal Xi. The decoders 203 and 204 are similar in internal design to the decoders 201 and 202 respectively. The write word lines Ww1 extend from the output terminals of the word line driver 214 to the input sections 91 of the memory cells 209.

As in the case of FIG. 6, the memory cell array 207 is divided into sections each having 8 words and being sequentially arranged, and each of the words in alternate 8-word sections has two different addresses and two different window numbers while each of the words in the other alternate 8-word sections has a single address and a single window number.

During a data reading mode of operation of the memory unit, the address signal Ai and the window signal Wi are inputted into the decoders 201 and 202. The window signal Wi designates a used window. The address signal Ai and the window signal Wi are decoded by the decoders 201 and 202. The gate circuit 210 includes OR gates executing logic OR operations between the output signals from the decoders 201 and 202 which depend on the address signal Ai and the window signal Wi. The gate circuit 210 includes AND gates receiving the output signals from the OR gates and also receiving the clock signal $\Phi 1$. The AND gates are opened in response to the clock signal $\Phi 1$, and the output signals from the OR gates (the output signals from the decoders 201 and 202) are transmitted through the AND gates to the word line driver 212. One of the read word lines Wr1 is selected and is activated by the word line driver 212 in response to the output signals from the decoders 201 and 202 which depend on the address signal Ai and the window signal Wi. One of the decoders 201 and 202 is designed so that it will output an inactive signal for the address signal Ai and the window signal Wi designating a word having a single address, and that it will output an active signal for the address signal Ai and the window signal Wi designating a word having two addresses. The other of the decoders 201 and 202 is designed so that it will output an active signal for the address signal Ai and the window signal Wi designating a word having either a single address or two addresses. One of the decoders 201 and 202 executes the decoding of the left-hand members while the other executes the decoding of the right-hand members of the overlap segments of FIG. 6. The output sections 93 of the memory cells 209 which are connected to the activated word line Wr1 are controlled in response to the word line activation, and the output sections 93 discharge and non-discharge the read bit lines Br connected thereto in accordance with data in the memory elements 95 and thereby output the data from the memory elements 95 to the read bit lines Br. It should be noted that the read bit lines Br are precharged by the precharge circuit 208 before being discharged. The data on the read bit lines Br are transmitted to an external circuit (not shown) via the input/output device 213.

The data reading mode of operation of the memory unit will be further explained with respect to the selection of a word having two addresses. For example, in the ease where the address signal Ai has a state "Ai=8 (r8)" and the window signal Wi has a state "Wi=2 (w2)" as illustrated in the hatched segment of FIG. 6, one of the word lines Wr1 is activated by the cooperation between the decoder 201 and the word line driver 212. In the counterpart ease where the address signal Ai has a state "Ai=24 (r24)" and the window signal Wi has a state "Wi=1 (w1)" as illustrated in the hatched segment of FIG. 6, one of the word lines Wr1 is activated by the cooperation between the decoder 202 and the word line driver 212.

During a data writing mode of operation of the memory unit, the address signal Ci and the window signal Xi are inputted into the decoders 203 and 204. The window signal Xi designates a used window. The address signal Ci and the window signal Xi are decoded by the decoders 203 and 204. The gate circuit 211 includes OR gates executing logic OR operations between the output signals from the decoders 203 and 204 which depend on the address signal Ci and the window signal Xi. The output signals from the OR gates (the output signals from the decoders 203 and 204) are transmitted to the word line driver 214. One of the write word lines Ww1 is selected and is activated by the word line driver 214 in response to the output signals from the decoders 203 and 204 which depend on the address signal Ci and the window signal Xi. One of the decoders 203 and 204 is designed so that it will output an inactive signal for the address signal Ci and the window signal Xi designating a word having a single address, and that it will output an active signal for the address signal Ci and the window signal Xi designating a word having two addresses. The other of the decoders 203 and 204 is designed so that it will output an active signal for the address signal Ci and the window signal Xi designating a word having either a single address or two addresses. One of the decoders 203 and 204 executes the decoding of the left-hand members while the other executes the decoding of the right-hand members of the overlap segments of FIG. 6. The input sections 91 of the memory cells 209 which are connected to the activated word line Ww1 are controlled in response to the word line activation, and the input sections 91 transmit the data from the write bit lines Bw to the memory cells 95 so that the data are written into the memory cells 95.

The data writing mode of operation of the memory unit will be further explained with respect to the selection of a word having two addresses. For example, in the case where the address signal Ci has a state "Ci=8 (r8)" and the window signal Xi has a state "Xi=2 (w2)" as illustrated in the hatched segment of FIG. 6, one of the word lines Ww1 is activated by the cooperation between the decoder 203 and the word line driver 214. In the counterpart case where the address signal Ci has a state "Ci=24 (r24)" and the window signal Xi has a state "Xi=1 (w1)" as illustrated in the hatched segment of FIG. 6, one of the word lines Ww1 is activated by the cooperation between the decoder 204 and the word line driver 214.

As understood from the previous description, the memory unit dispenses with address conversion. Therefore, the memory unit is advantageous over the prior art of FIGS. 1–3 in the speed of data-reading and data-writing operation.

Various modifications may be made in this embodiment. For example, words each having a single address are divided into two groups which are equal in the number of members, and the words in the first group are allotted to the decoder 201 (or the decoder 203) while the words in the second group are allotted to the decoder 202 (or the decoder 204). In this case, the load capacities of the decoders 201 and 202 (or the decoders 203 and 204) are equalized so that a higher speed of operation of the memory unit is attained.

DESCRIPTION OF THE FIFTH PREFERRED EMBODIMENT

Figure 11:
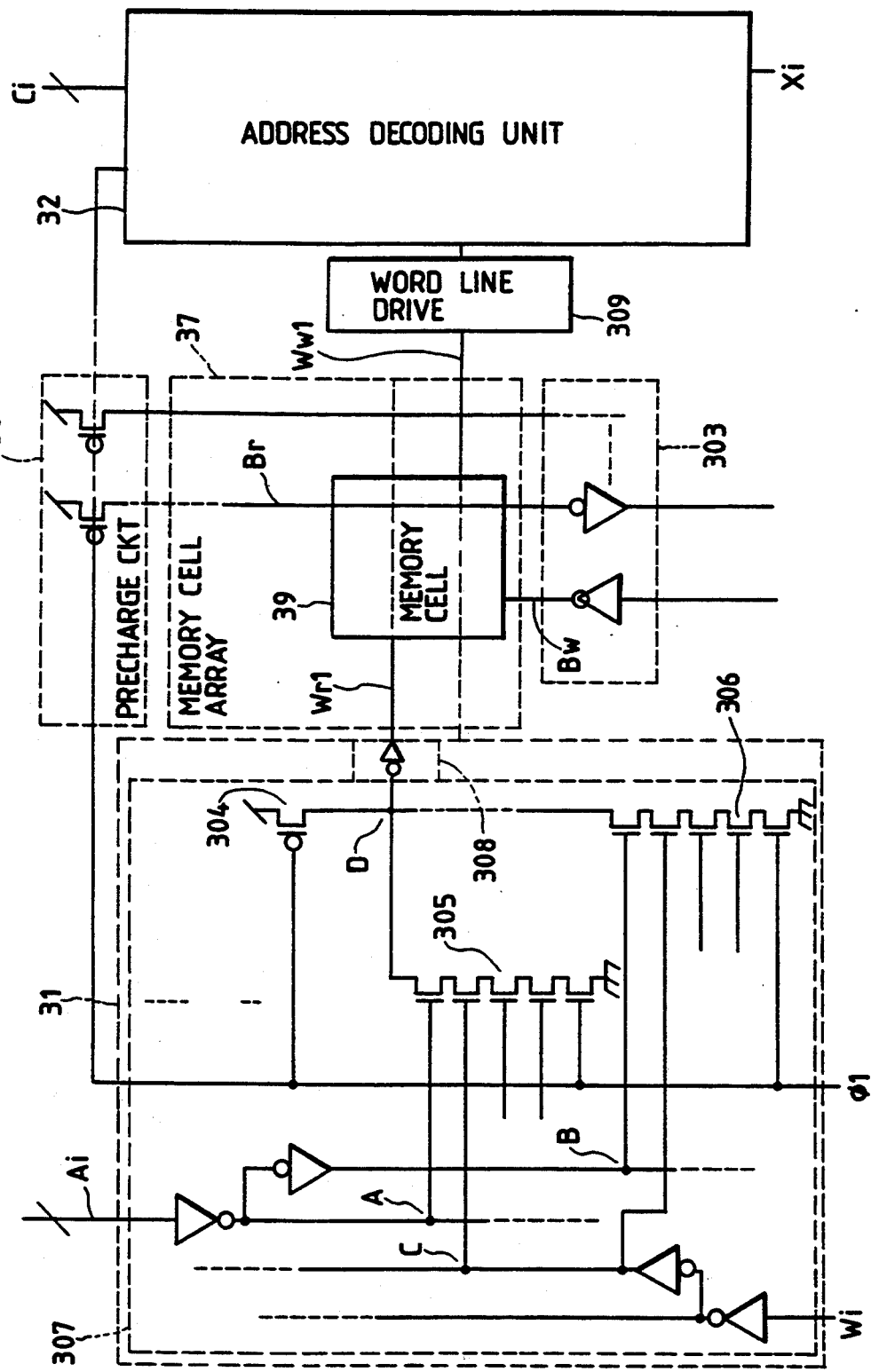
FIG. 11 is a block diagram of a memory unit according to a fifth embodiment of this invention.

With reference to FIG. 11, a memory unit has 8 windows each having 32 registers. The memory unit includes an array 37 of memory cells 39. The memory cell array 37 has a capacity of, for example, 136 words by 32 bits.

The memory cells 39 are similar to the memory cell of FIG. 3. Each memory cell 39 includes an input section 91, an output section 93, and a memory element 95 connected between the input section 91 and the output section 93. The output section 93 is connected to a read bit line Br. The output section 93 serves to output data from the memory element 95 to the read bit line Br. A read word line Wr1 is connected to the output section 93. The input section 91 is connected to a write bit line Bw. The input section 91 serves to input data from the write bit line Bw into the memory element 95. A write word line Ww1 is connected to the input section 91.

An address decoding unit 31 includes a decoder section 307 and a word line driver 308. The decoder section 307 includes inverters (no reference character), p-channel transistors 304 and transistor sets 305 and 306. Each of the transistor sets 305 and 306 constitutes an AND circuit. The transistor sets 305 and 306 form pairs which are connected to the transistors 304 respectively. Each of the transistor sets 305 includes n-channel transistors whose source-drain paths are connected in series, and the gate of the cold end transistor receives a clock signal $\Phi 1$ and the gates of the other transistors receive respective bits of an address signal Ai and a window signal Wi via the inverters, while the drain of the hot end transistor is connected to an input terminal of the word line driver 308 and is also connected to the drain of the transistor 304 via a node D. The gate of the transistor 304 receives the clock signal $\Phi 1$. Similarly, each of the transistor sets 306 includes n-channel transistors whose source-drain paths are connected in series, and the gate of the cold end transistor receives the clock signal $\Phi 1$ and the gates of the other transistors receive respective bits of the address signal Ai and the window signal Wi via the inverters, while the drain of the hot end transistor is connected to the input terminal of the word line driver 308 and is also connected to the drain of the transistor 304 via the node D. The gates of the transistors 304 receive the clock signal $\Phi 1$, The decoder section 307 operates in synchronism with the clock signal $\Phi 1$. In other words, the decoder section 307 is controlled by the clock signal $\Phi 1$. The read word lines Wr1 extend from the output terminals of the word line driver 308 to the output sections 93 of the memory cells 39.

A precharge circuit 38 receiving the clock signal $\Phi 1$ is connected to the read bit lines Br extending from the output sections 93 of the memory cells 39. The precharge circuit 38 serves to precharge the read bit lines Br in response to the clock signal $\Phi 1$. Thus, the precharge circuit 38 operates in synchronism with the clock signal $\Phi 1$.

An input/output device 303 is connected to the write bit lines Bw and the read bit lines Br leading to the input sections 91 and the output sections 93 of the memory cells 39. The input/output device 303 serves to transmit data from the read bit lines Bw to an external circuit (not shown). In addition, the input/output device 303 serves to transmit data from an external circuit (not shown) to the write bit lines Bw.

An address decoding unit 32 is similar in internal design to the address decoding unit 31. The address decoding unit 32 includes a word line driver 309, although the word line driver 309 is illustrated as being separate from the address decoding unit 32 in FIG. 11. The address decoding unit 32 receives an address signal Ci and a window signal Xi. The output terminals of the address decoding unit 32 is connected to the input terminal of the word line driver 309. The write word lines Ww1 extend from the output terminals of the word line driver 309 to the input sections 91 of the memory cells 39.

As in the case of FIG. 6, the memory cell array 37 is divided into sections each having 8 words and being sequentially arranged, and each of the words in alternate 8-word sections has two different addresses and two different window numbers while each of the words in the other alternate 8-word sections has a single address and a single window number.

During a data reading mode of operation of the memory unit, the address signal Ai and the window signal Wi are inputted into the decoder section 307. The window signal Wi designates a used window. The address signal Ai and the window signal Wi are decoded by the combination of the inverters and the transistor sets 305 and 306 in the decoder section 307. When the clock signal $\Phi 1$ is in a low level, the nodes D are precharged by the transistors 304. During this period, the transistor sets 305 and 306 are kept in OFF states by the clock signal Φ1. When the clock signal Φ1 changes to a high level, one of the transistor sets 305 and 306 is moved into an ON state in accordance with the address signal Ai and the window signal Wi so that the related node D is discharged and therefore the related read word line Wr1 is activated by the word line driver 308. In this way, one of the read word lines Wr1 is selected and is activated by the word line driver 308 in response to the output signals from the decoder section 307 which depend on the address signal Ai and the window signal Wi. The output sections 93 of the memory cells 39 which are connected to the activated word line Wr1 are controlled in response to the word line activation, and the output sections 93 discharge and non-discharge the read bit lines Br connected thereto in accordance with data in the memory elements 95 and thereby output the data from the memory elements 95 to the read bit lines Br. It should be noted that the read bit lines Br are precharged by the precharge circuit 38 before being discharged. The data on the read bit lines Br are transmitted to an external circuit (not shown) via the input-/output device 303.

The transistor sets 305 and 306 are designed so as to realize the following operation. The transistor sets 305 output inactive signals for the address signal Ai and the window signal Wi designating a word having a single address, and one of the transistor sets 305 outputs an active signal for the address signal Ai and the window signal Wi designating a word having two addresses. One of the transistor sets 306 outputs an active signal for the address signal Ai and the window signal Wi designating a word having either a single address or two addresses. The transistor sets 306 execute the decoding of the left-hand members while the transistor sets 305 execute the decoding of the right-hand members of the overlap segments of FIG. 6.

The data reading mode of operation of the memory unit will be further explained with respect to the selection of a word having two addresses. For example, in the case where the address signal Ai has a state "Ai=8 (r8)" and the window signal Wi has a state "Wi=2 (w2)" as illustrated in the hatched segment of FIG. 6, one of the word lines Wr1 is activated by the cooperation between one of the transistor sets 305 and the word line driver 308. In the counterpart case where the address signal Ai has a state "Ai=24 (r24)" and the window signal Wi has a state "Wi=1 (w1)" as illustrated in the hatched segment of FIG. 6, one of the word lines Wr1 is activated by the cooperation between one of the transistor sets 306 and the word line driver 308.

During a data writing mode of operation of the memory unit, the address signal Ci and the window signal Xi are inputted into the address decoding unit 32. The window signal Xi designates a used window. The address signal Ci and the window signal Xi are decoded by the address decoding unit 32 as in the previously-mentioned data reading mode of operation. As a result of the decoding of the address signal Ci and the window signal Xi, one of the write word lines Wr1 is selected and is activated by the word line driver 309 in accordance with the address signal Ci and the window signal Xi. The input sections 91 of the memory cells 39 which are connected to the activated word line Ww1 are controlled in response to the word line activation, and the input sections 91 transmit the data from the write bit lines Bw to the memory cells 95 so that the data are written into the memory cells 95.

As shown in FIG. 11, in the address decoding unit 31, each of nodes A, B, and C is connected to only a n-channel transistor within the transistor set 305 or 306. This arrangement enables a very small stray capacitance connected to each of the nodes A, B, and C, so that a high-speed decoding operation can be realized.

As understood from the previous description, the memory unit dispenses with address conversion. Therefore, the memory unit is advantageous over the prior art of FIGS. 1–3 in the speed of data-reading and data-writing operation.

Various modifications may be made in this embodiment. For example, words each having a single address are divided into two groups which are equal in the number of members, and the words in the first group are allotted to the transistor sets 305 while the words in the second group are allotted to the transistor sets 306. In this case, the load capacities of the two decoding parts are equalized so that a higher speed of operation of the memory unit is attained.

What is claimed is:

1. A memory unit responsive to an address signal representing a plurality of addresses comprising:
    a memory cell to which first and second addresses are previously assigned;
    a first decoder having a first address assignment for states of the address signal, said first decoder directly connected to an address line providing said address signal thereto and connected to the memory cell for decoding a first state of the address signal representing the first address into a first selection signal, and for outputting the first selection signal to access the memory cell;
    a second decoder having a second address assignment for said states of the address signal, said second address assignment being different from said first address assignment so that said first and second decoders respectively enable access to a specific memory cell in response to two respectively different states of the address signal,
    said second decoder directly connected to said address line providing said address signal in common thereto and to said first decoder,
    said second decoder further connected to the memory cell for decoding a second state of the address signal representing the second address into a second selection signal, and for outputting the second selection signal to said memory cell;
    a common bit line; and
    means for accessing said memory cell in response to each of the first selection signal and the second selection signal for enabling transmission of data between the memory cell and the common bit line in response to each of said first and second different states of said address signal.

2. A memory unit responsive to an address signal, comprising:
    a memory cell to which first and second addresses are previously assigned;
    a first decoder having a first address assignment and connected to the memory cell for decoding a first state of the address signal representing the first address into a first selection signal, and for outputting the first selection signal to the memory cell;
    a second decoder having a second address assignment and connected to the memory cell for decoding a second state of the address signal representing the second address into a second selection signal, and for outputting the second selection signal to the memory cell, the second address assignment being different from the first address assignment; and a common bit line connected to the memory cell;

wherein the memory cell comprises a memory element for storing data, first means connected to the first decoder, the memory element, and the common bit line for connecting the memory element and the common bit line to transmit data therebetween in response to the first selection signal, and second means connected to the second decoder, the memory element, and the common bit line for connecting the memory element and the common bit line to transmit data therebetween in response to the second selection signal.

3. A memory unit as recited in claim 2, wherein said first and second addresses are different, and said first and second means operate for connecting the memory element and the common bit line to transmit data therebetween in response to said first and second states of the address signal representing said first and second different addresses, respectively.

4. A memory unit as recited in claim 2, wherein said first and second means operate for connecting the memory element and the common bit line to transmit data to the memory element from the common bit line for storage therein in response to said first and second states of the address signal representing said first and second addresses, and further comprising:

a further common bit line connected to the memory cell;

wherein the memory cell further comprises:

third means connected to the first decoder, the memory element, and the further common bit line for connecting the memory element and the further common bit line to transmit data from the memory element to the further common bit line in response to the first selection signal corresponding to said first state of the address signal; and fourth means connected to the second decoder, the memory element, and the further common bit line for connecting the memory element and the further common bit line to transmit data from the memory element to the further common bit line in response to the second selection signal corresponding to said second state of the address signal.

5. A memory unit as recited in claim 4, wherein said first and second addresses are different, said third and fourth means operating for connecting the memory element and the further common bit line to transmit data from the memory element to the further common bit line in response to said first and second states of the address signal representing said first and second different addresses, respectively.

* * * * *